United States Patent [19]

McDonald et al.

[11] Patent Number: 4,893,073
[45] Date of Patent: Jan. 9, 1990

[54] ELECTRIC CIRCUIT BOARD CURRENT SENSOR

[75] Inventors: Brian P. McDonald, Saginaw; Steven J. Collier-Hallman, Frankenmuth, both of Mich.

[73] Assignee: General Motors Corporation, Detroit, Mich.

[21] Appl. No.: 303,702

[22] Filed: Jan. 30, 1989

[51] Int. Cl.$^4$ .................. G01R 33/00; H05K 13/04; F02P 3/00
[52] U.S. Cl. .................. 324/117 H; 29/602.1; 29/832; 307/309; 324/127
[58] Field of Search .............. 324/117 H, 117 R, 127, 324/251; 29/602.1, 606, 832; 307/309; 338/32 H; 323/368; 174/68.5

[56] References Cited

U.S. PATENT DOCUMENTS 4,124,936 11/1978 Jellissen ........................ 29/602.1
4,639,665 1/1987 Gary ............................ 324/117 H
4,704,575 11/1987 Arnoux et al. .................. 324/117 H

FOREIGN PATENT DOCUMENTS 2918329 12/1980 Fed. Rep. of Germany ... 324/117 H

OTHER PUBLICATIONS

Arnold et al.; "Hall Effect . . . "; IBM Tech. Dis. Bull.; vol. 17; No. 11; Apr. 1975; pp. 3218–3219.

Primary Examiner—Ernest F. Karlsen
Attorney, Agent, or Firm—Robert M. Sigler

[57] ABSTRACT

An electric circuit board has a current trace thereon and a notch in the edge and an opening therethrough on opposite sides of the trace. A magnetic sensor is retained in the opening; and a flux member retained by the notch and opening forms a magnetic circuit around the current trace to concentrate current induced flux through the magnetic sensor. The flux member is made of a ductile magnetic material and is therefore easy to manufacture and handle without breakage compared to prior art ferrite flux members. It is also resilient so as to permit a "snap-on" design for ease of assembly with positive retention of the flux member on the board and of the magnetic sensor within the opening with minimal series air gap. The flux member further has high internal eddy current and hysteresis losses for inherent high frequency filtering to reduce aliasing distortion in sensor output to digital apparatus when applied to a measurement of PWM motor current.

3 Claims, 1 Drawing Sheet

ELECTRIC CIRCUIT BOARD CURRENT SENSOR

BACKGROUND OF THE INVENTION

This invention relates to an electric circuit board with a current sensor for one of the current traces thereon and a method for assembling the board and sensor.

It has been long known that an electric current through a current conducting element can be sensed by sensing a magnetic field surrounding the current conducting element. This magnetic field can be concentrated by a flux member surrounding the current conducting element which creates a magnetic circuit and includes a magnetic sensor. The principle is used in prior art devices such as the Hall-effect current clamp shown in U.S. Pat. No. 4,704,575, issued to Arnoux et al on Nov. 3, 1987, in which members 5a and 5b comprise a magnetic circuit including Hall effect cell 8, which circuit will respond to current through a conductor 6 when the magnetic circuit surrounds the conductor. A similar arrangement is shown in the Gary U.S. Pat. No. 4,639,665, issued Jan. 27, 1987.

However, the particular apparatus shown in these prior art patents is not particularly suited to circuit board applications, due to its size and the fact that no method for attaching the apparatus conveniently and securely to the circuit board is shown. In particular, the flux member for such apparatus in the prior art is generally made from a crystalline ceramic ferrite, which has favorable eddy current and hysteresis properties but, due to its hard and brittle nature, is expansive to manufacture, inflexible, easily broken and difficult to mount on a circuit board.

SUMMARY OF THE INVENTION

The apparatus of this invention is a circuit board current sensor which is an improvement over the prior art with a structure which is easily and inexpensively manufactured and easily handled without breakage. It works best in high current sensing applications and, due to inherent high frequency losses, offers a particular additional advantage where high frequency filtering is desired. An advantageous application is a pulse width modulated (PWM) motor control with a sensor output to digital apparatus such as a computer control, where high frequency noise must be filtered to prevent aliasing distortion of the sampled sensor signal. It was particularly designed for a PWM motor control board in an electric power steering system for a motor vehicle.

The apparatus of the invention is an electric circuit board current sensor comprising a circuit board of insulating material with a thin current trace of electrically conducting material on one side of the circuit board near an edge thereof, other electric components on the circuit board effective, when electric power is applied thereto, to produce an electric current through the current trace. The circuit board has a notch in the edge and an opening therethrough on opposite sides of the current trace.

The apparatus further comprises a magnetic sensor in the opening and a flux member mounted on the circuit board surrounding the current trace. The flux member is made of a ductile magnetic material and has a first portion thereof adjacent the circuit board on the side there of opposite the current trace with a free end comprising a latching portion inserted in the opening, a second portion on the same side of the circuit board as the current trace but spaced therefrom with a free end adjacent the opening, and an end portion engaging the notch and joining the first and second portions on the other side of the current trace from the free ends. The free ends are biased by an internal spring characteristic of the flux member to engage opposite sides of the magnetic sensor and thus complete a magnetic circuit therewith around the current trace. The flux member is thus positively retained on the circuit board in a predetermined alignment around the current trace by the notch and opening of the circuit board.

The apparatus is assembled by separating the free ends of the flux member, inserting the circuit board at the notch between the separated free ends, moving the flux member and circuit board relatively normally to the edge of the circuit board with the opening engaging portion of the flux member approaching the opening in the circuit board, and releasing the free ends to allow the opening engaging portion of the flux member to enter the opening and be retained thereby as the notch engaging end portion enters the notch. The flux member is thus positively retained on the circuit board in a predetermined alignment by the notch and opening of the circuit board and has an internal spring characteristic biasing the free ends of the first and second portions toward each other and securely against opposite sides of the magnetic sensor, whereby current through the current trace generates a magnetic flux in the flux member which is sensed by the magnetic sensor. Further details and advantages of the invention will be apparent from the accompanying drawings and following description of a preferred embodiment.

DESCRIPTION OF THE PREFERRED EMBODIMENT

Figure 1:
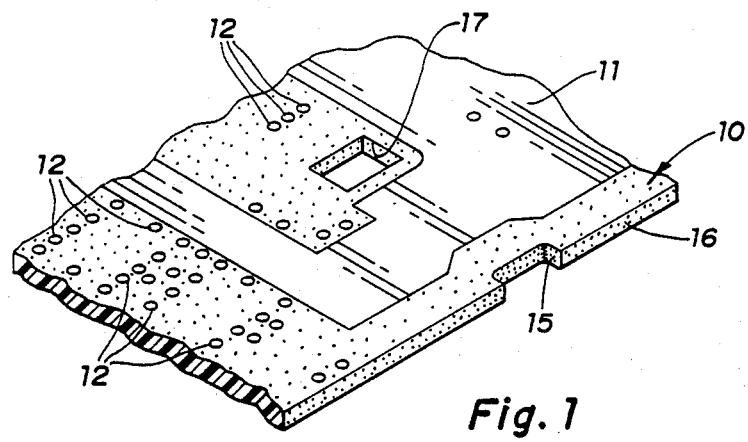
FIG. 1 shows a perspective view of a circuit board having a circuit trace, but with all other components removed to more clearly show the notch and opening of the board.
Figure 2:
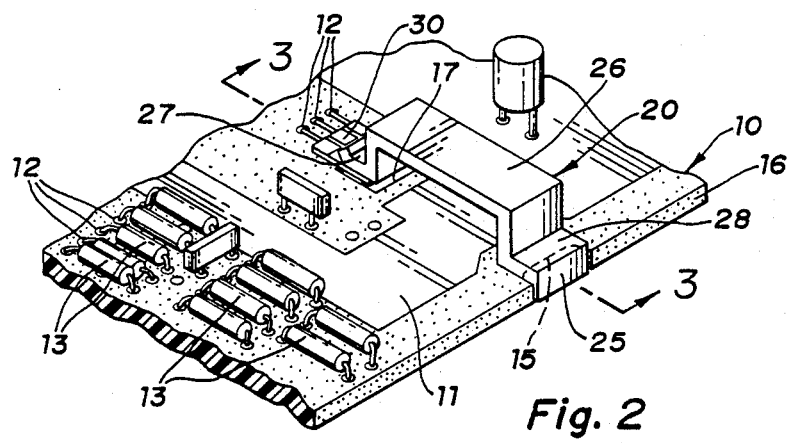
FIG. 2 shows a circuit board current sensor according to the invention using the basic circuit board of FIG. 1.

Referring to FIG. 1, a board 10 of an insulating material such as glass filled epoxy is provided with a current trace 11 on one side. Current trace 11 is formed from a thin coating of copper or a similar conducting material in the normal manner of electric circuit boards end is exceptional in no way except that, in this embodiment, it is very wide to accommodate a high current flow such as 40 amps. Board 10 is further provided with a plurality of small circular openings 12 adapted for the insertion of component leads. These openings are interconnected in a predetermined pattern by other current traces which can be on either side of the board. Electric components 13, seen in FIG. 2, are mounted on board 10 by having their leads bent parallel and inserted through openings 12 and then soldered to the current traces on the opposite side of the board.

Referring again to FIG. 1, board 10 is provided with a notch 15 in one edge 16 adjacent current trace 11 and an opening 17 therethrough adjacent trace 11 opposite notch 15. Notch 15 and opening 17 are adapted to retain a flux member 20, which is shown in place in FIG. 2 and, in section, in FIG. 3. Flux member 20 is made of a ductile magnetic material such as 3 percent silicon iron. Flux member 20 is thus inexpensively manufactured by stamping and cutting and is not brittle or easily broken. It is also characterized by a resiliency which allows it to bend but creates a resulting internal bias or tension tending to return it to its original shape so that it can be deformed to slide over the edge of a circuit board and "snap" into place with a portion in a retaining opening.

Figure 3:
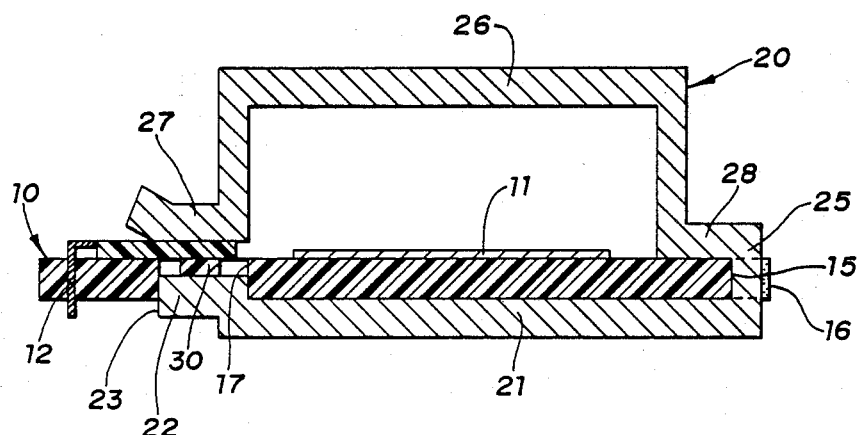
FIG. 3 is a section view along the lines 3—3 in FIG. 2 which shows details of the physical and magnetic relationship between the flux member, magnetic sensor and circuit board.

Flux member 20 has a first portion 21, shown in FIG. 3, which extends under circuit board 10 from notch 15 to opening 17 flat against the board. There is no circuit trace in the area of board 10 on the under side of the board which could be in contact with portion 21. Portion 21 has a stepped latching portion 22 formed in the free end 23 thereof. Latching portion 22 is sized to fit snugly into opening 17 when an end portion 25 at the other end of portion 21 is retained within notch 15.

Flux member 20 further has a second portion 26 extending from end portion 25 across the top of board 10 over current trace 11 and ending in a free end 27. Second portion 26 is spaced upward from board 10 across most of its length to prevent undesirable flux leakage between first and second portions 21, 26 of flux member 20. Free end 27 of second portion 26 extends downward toward board 10, as does a section 28 of the other end of second portion 26 adjacent end portion 25.

A magnetic sensor 30, such as a Hall effect device, is retained in opening 17 between free ends 23 and 27 of flux member 20, with a flat portion extending over the circuit board and leads projecting downward through some of openings 12 for soldering into the circuit. Flux member 20 is slightly distorted in the position shown with an internal closing bias tending to engage latching portion 22 and free end 27 with opposite sides of magnetic sensor 30 for secure retention of the sensor and creation of a magnetic circuit around current trace 11 effective to concentrate the current induced magnetic flux through the sensor. In order to minimize stray flux, it is desirable that any air gap in the circuit be small in relation to the distance between the first and second portions of flux member 20. The ratio is shown in the drawings as about 1:5 which appears to be adequate, although it would be even better at a ratio of about 1:10. Clearly, the ratio is not a simple choice of the designer, who has to deal with the thickness of available magnetic sensors vs. the allowable height of flux member 20 above board 10.

The physical relationship between flux member 20 and board 10 results in a secure retention of flux member 20 by a simple snap-on assembly without glue or special mounting hardware. Portion 22, which snaps into opening 17 and fits snugly therein, prevents movement of flux member 20 in the direction across current trace 11 and in the direction of current trace 11 at the free ends of the flux member. The other end 25 of the flux member is retained against movement in the direction of current trace 11 by its retention in notch 15. First portion 21 of flux member 20 is held firmly against the bottom of board 10 by section 28 and free end 27. In assembly, flux member 20, with its free ends slightly spread, has board 10 inserted between the free ends and is moved across current trace 11 until end 25 enters notch 15 and portion 22, with the free ends released, snaps into opening 17.

In operation in its most advantageous application, current trace 11 carries a PWM motor current of about 40 amps which is switched at a rate of about 5-20 KHz. The sensor output of magnetic sensor 30 is provided to a digital sampler for application to a digital control, the sampler having a sampling rate, such as 70-1,000 Hz, which is low compared to the switching noise in the current to be measured. Thus, the potential for aliasing distortion exists in the current measurement unless the signal from magnetic sensor 30 is filtered to reduce or eliminate the high frequency noise. The ductile magnetic iron of flux member 20, however, has significant high frequency losses due to eddy currents and hysteresis. Although this would make the sensor less accurate at low current levels, in this application it helps reduce the need for electronic filtering in the output signal of magnetic sensor 30 compared to that which would be necessary with a typical prior art ferrite flux member, which is characterized by low eddy current and hysteresis losses. Flux member 20 thus provides circuit operating advantages in many applications as well as advantages in cost, manufacturing and handling.

The embodiments of the invention in which an exclusive property or privilege is claimed are defined as follows:

1. An electric circuit board current sensor comprising a circuit board of insulting material with a thin current trace of electrically conducting material on one side of the circuit board near an edge thereof, other electric components on the circuit board effective, when electric power is applied thereto, to produce an electric current through the current trace, a notch in the edge of the circuit board and an opening therethrough on opposite sides of the current trace, a magnetic sensor In the opening and a flux member mounted on the circuit board surrounding the current trace;

the flux member being made of a ductile magnetic material and having a first portion thereof adjacent the circuit board on the side thereof opposite the current trace with a free end comprising a latching portion inserted in the opening, a second portion on the same side of the circuit board as the current trace but spaced therefrom with a free end adjacent the opening, and an end portion engaging the notch and joining the first and second portions on the other side of the current trace from the free ends, the free ends being biased by an internal spring characteristic of the flux member to engage opposite sides of the magnetic sensor and thus complete a magnetic circuit therewith around the current trace, the flux member being positively retained on the circuit board in a predetermined alignment around the current trace by the notch and opening of the circuit board, whereby current through the current trace generates a magnetic flux in the flux member which is sensed by the magnetic sensor.

2. The electric circuit board current sensor of claim 1 in which the electric current produced in the current trace is a pulse width modulated current and the ductile magnetic material of the flux member has high internal eddy current and hysteresis losses effective to suppress high frequency noise in the signal sensed by the magnetic sensor.

3. The method of assembling a circuit board current sensor comprising the steps of:

forming, in a circuit board of insulating material having a current trace of conducting material on one side, a notch in the edge of the board and an opening therethrough on opposite sides of the current trace:

placing a magnetic sensor in the opening;
forming, from a ductile magnetic material, a resilient flux member having first and second portions ending in adjacent free ends and joined at the opposite ends in a notch engaging end portion with an opening engaging portion on the free end of the first portion;
separating the free ends of the flux member to allow insertion of the circuit board therebetween;
inserting the circuit board at the notch between the separated free ends;

moving the flux member and circuit board relatively normally to the edge of the circuit board with the opening engaging portion of the flux member approaching the opening in the circuit board; and
releasing the free ends to allow the opening engaging portion of the flux member to enter the opening and be retained thereby as the notch engaging end portion enters the notch to be engaged thereby, the free ends retaining the magnetic sensor securely within the opening.

* * * * *